(12) United States Patent
Chang

(10) Patent No.: US 7,589,342 B2
(45) Date of Patent: Sep. 15, 2009

(54) PHASE CHANGE MEMORY DEVICE HAVING CARBON NANO TUBE LOWER ELECTRODE MATERIAL AND METHOD OF MANUFACTURING THE SAME

(75) Inventor: Heon Yong Chang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 203 days.

(21) Appl. No.: 11/648,320

(22) Filed: Dec. 29, 2006

(65) Prior Publication Data
US 2007/0241319 A1 Oct. 18, 2007

(30) Foreign Application Priority Data
Apr. 14, 2006 (KR) .................. 10-2006-0034097

(51) Int. Cl.
*H01L 47/00* (2006.01)
(52) U.S. Cl. .......... 257/3; 257/4; 257/42; 257/E45.002; 438/102; 438/900; 977/943
(58) Field of Classification Search ............. 257/3, 257/E45.002, 4, 42; 438/102, 900; 977/943
See application file for complete search history.

(56) References Cited
U.S. PATENT DOCUMENTS
5,838,035 A * 11/1998 Ramesh ............. 257/295

2007/0012956 A1* 1/2007 Gutsche et al. ......... 257/246

FOREIGN PATENT DOCUMENTS

| JP | 2004-006864 | | 1/2004 |
|---|---|---|---|
| KR | 10-2003-0037678 | | 5/2003 |
| KR | 1020040094065 | A * | 11/2004 |
| KR | 10-20040106824 | | 12/2004 |
| KR | 1020060015181 | A * | 2/2006 |

OTHER PUBLICATIONS

Korean Patent Gazette, May 7, 2007.

* cited by examiner

*Primary Examiner*—Tu-Tu V Ho
(74) *Attorney, Agent, or Firm*—Ladas & Parry LLP

(57) ABSTRACT

Disclosed is a phase change memory device including: a semiconductor substrate formed with a first insulating interlayer having a first contact hole; a contact plug formed in such a manner so as to be recessed within the first contact hole; a catalyst layer formed on the contact plug in such a manner so as to fill the first contact hole; a second insulating interlayer formed on the first insulating interlayer including the catalyst layer having a second contact hole through which the catalyst layer is exposed; a carbon nano tube lower electrode formed within the second contact hole in such a manner so as to come in contact with the catalyst layer; a phase change layer formed on the carbon nano tube lower electrode and a second insulating interlayer portion around the second contact hole; and an upper electrode formed on the phase change layer.

33 Claims, 10 Drawing Sheets

PHASE CHANGE MEMORY DEVICE HAVING CARBON NANO TUBE LOWER ELECTRODE MATERIAL AND METHOD OF MANUFACTURING THE SAME

CROSS-REFERENCES TO RELATED APPLICATION

The present application claims priority to Korean patent application number 10-2006-0034097, filed on Apr. 14, 2006, which is incorporated by reference in its entirety.

BACKGROUND OF THE INVENTION

The present invention relates to a phase change memory device, and more particularly to a phase change memory device in which a carbon nano tube is applied as a lower electrode material, and a manufacturing method thereof.

Memory devices are largely divided into Random Access Memory (RAM) and Read Only Memory (ROM) devices. Whereas a RAM device is a volatile memory device that loses input information if power is shut off, the ROM device is a non-volatile memory device that preserves the stored state of input information even in the event of a power shut off. Examples of the volatile RAM device include Dynamic Random Access memory (DRAM) devices and Static Random Access memory (SRAM) devices, and examples of the non-volatile ROM device include flash memory devices such as Electrically Erasable and Programmable ROM (EEPROM) devices.

It is well known in the art that although the DRAM device is a very good memory device, it is difficult to highly integrate because it requires a high charge storage capacity, thus requiring its electrode surface area to be increased. Further, it is also difficult to highly integrate the flash memory device because its laminated structure of two gates requires an operation voltage higher than a power source voltage, which necessitates a separate booster circuit to establish a voltage necessary for write and erase operations.

Thereupon, many studies are being pursued to develop new non-volatile memory devices with a simple structure that can be highly integrated. As an example of such memory devices, a phase change memory (in particular, phase change RAM) has recently been proposed.

The phase change memory device is a memory device in which the current flow between upper and lower electrodes causes the phase change layer interposed between the electrodes to undergo a phase change from a crystalline phase to an amorphous phase. The types of information stored in the memory cell are then discerned using the resistance difference according to the phase change of the phase change layer. More specifically, the phase change memory device uses a Chalcogenide layer, that is, a compound layer of Germanium (Ge), Stibium (Sb) and Tellurium (Te), as a phase change layer. Heat generated through the application of a current, that is, so-called Joule heat, causes the Chalcogenide layer to undergo a phase change between a crystalline phase and an amorphous phase. Here, because the phase change layer has a higher resistance when in the amorphous phase as compared to the crystalline phase, the phase change memory device determines whether information stored in a phase change memory cell corresponds to logic "1" or logic "0" by detecting the current flowing through the phase change layer in a read mode.

In such a phase change memory device, the crystalline-to-amorphous phase change of the phase change layer is referred to as "reset" while the amorphous-to-crystalline phase change of the phase change layer is referred to as "set". In view of current consumption and operation speed, it is optimal for the magnitude of a current inducing the reset/set (programming) to be as low as possible. Thus, the current required for the phase change must be lowered by minimizing the contact area between the phase change layer and the lower electrode. In order to do so, the lower electrode is conventionally formed in the shape of a plug while its diameter is reduced as much as possible.

However, when a nitride-based metal layer, such as a TiN, is formed as a plug-shaped lower electrode with a diameter of below 40 nm, it cannot endure a high-current density (about $10^8 A/cm^2$) at a narrow contact interface, thereby leading to the deterioration of its characteristics.

Thus, a material referred to as carbon nano tube, which has a hollow rod-like structure and excellent electrical conductivity properties, has been proposed as a new lower electrode material and is being vigorously researched.

The carbon nano tube has not only the electrical conductivity of several hundred times that of copper but also the thermal conductivity of fifteen times that of copper. Furthermore, the carbon nano tube never causes surface scattering or grain boundary scattering. Therefore, by applying the carbon nano tube as a plug-shaped lower electrode material, it is possible to create a phase change memory device that has high operation speed and low power consumption without risking deterioration of its characteristics even at a narrow contact interface with a diameter of below 40 nm.

A conventional phase change memory device in which a carbon nano tube is applied as a lower electrode material may be manufactured as follows.

A first contact hole is formed in the first insulating interlayer, and a contact plug is formed within the first contact hole. By using a damascene process, an insulating layer and an electrically conductive pattern contacting the contact plug are formed on the first insulating interlayer including the contact plug. A second insulating interlayer is formed on the insulating layer including the electrically conductive pattern, and a second contact hole, through which the electrically conductive pattern is exposed, is formed in the second insulating interlayer. A carbon nano tube is grown within the second contact hole by using the electrically conductive pattern as a catalytic agent. In this way, a carbon nano tube lower electrode is formed. A phase change layer and an upper electrode are formed in sequence on the carbon nano tube lower electrode and the second insulating interlayer portion adjacent thereto.

The electrically conductive pattern is formed using a damascene process, and it subsequently functions as a catalytic agent for the growth of the carbon nano tube. The electrically conductive pattern is formed using a damascene process to ensure the uniformity of the thickness of the second insulating interlayer. If the electrically conductive pattern is instead formed using a common patterning method, the insulating layer is formed on the first insulating interlayer in such a manner so as to cover the electrically conductive pattern, thus requiring the planarization of the surface of the insulating layer by means of a Chemical mechanical Polishing (CMP) process. However, since the polishing speed of the CMP process differentiates from place to place of a wafer, it is difficult to ensure the uniformity of the insulating interlayer's thickness, and thus the contact hole for the lower electrode cannot be formed with a uniform size, resulting in uneven device characteristics. The electrically conductive pattern is therefore formed using a damascene process.

As stated above, in view of the superior current density endurance of the carbon nano tube, a phase change memory device with low power consumption and high operation speed can be manufactured when the carbon nano tube is applied as a lower electrode material.

However, in the above-mentioned prior art, the need to separately form the insulating layer and the electrically conductive pattern leads to an increase in the overall height of the device and creates difficulties in the manufacturing process. Furthermore, the use of a damascene process to form the electrically conductive pattern and the insulating layer in order to ensure the uniformity of the thickness of the second insulating layer, also burdens the manufacturing process.

BRIEF SUMMARY OF THE INVENTION

Embodiments of the present invention are directed to a phase change memory device that overcomes the disadvantages of the prior art, such as the increase in device height and complexities of manufacturing processes, through the formation of an electrically conductive pattern functioning as a catalyst layer, and a manufacturing method thereof.

In one embodiment of the present invention, there is provided a phase change memory device including: a semiconductor substrate formed with a first insulating interlayer having a first contact hole; a contact plug formed in such a manner so as to be recessed within the first contact hole; a catalyst layer formed on the contact plug in such a manner as to fill the first contact hole; a second insulating interlayer formed on the first insulating interlayer including the catalyst layer with a second contact hole through which the catalyst layer is exposed; a carbon nano tube lower electrode formed within the second contact hole in such a manner as to come in contact with the catalyst layer; a phase change layer formed on the carbon nano tube lower electrode and a second insulating interlayer portion around the second contact hole; and an upper electrode formed on the phase change layer.

The contact plug may be made of tungsten.

The phase change memory device according to this embodiment of the present invention may further include a barrier layer made of TiN interposed between the contact plug and the first insulating interlayer.

The carbon nano tube lower electrode may be formed in such a manner so as to have the same diameter as that of the second contact hole and a lower height than that of the second contact hole.

The carbon nano tube lower electrode may be formed in such a manner so as to have a smaller diameter than that of the second contact hole, and a sidewall insulating layer may be interposed between the carbon nano tube lower electrode and the second insulating interlayer.

Both the carbon nano tube lower electrode and the sidewall insulating layer may be formed in such manner so as to have a lower height than that of the second contact hole.

The carbon nano tube lower electrode may be formed in such a manner so as to have a lower height than that of the second contact hole, and the sidewall insulating layer may be formed in such a manner so as to have the same height as that of the second contact hole.

Both the carbon nano tube lower electrode and the sidewall insulating layer may be formed in such manner so as to have the same height as that of the second contact hole.

The sidewall insulating layer may be made of a porous material with a higher porosity than that of the second insulating interlayer.

The catalyst layer may be made of any one selected from the group consisting of TiN, TiAlN, Co, and Ru.

The carbon nano tube lower electrode may be formed in such a manner so as to be recessed within the second contact hole, and the phase change layer may be formed in the upper-end portion of the second contact hole where the carbon nano tube lower electrode is not formed.

In another embodiment of the present invention, there is provided a method of manufacturing the phase change memory device, the method including the steps of: forming a first insulating interlayer, which has a first contact hole, on a semiconductor substrate; forming a contact plug recessed within the first contact hole; forming a catalyst layer on the contact plug in such a manner so as to fill the first contact hole; forming a second insulating interlayer on the first insulating interlayer including the catalyst layer; etching the second insulating interlayer, thereby forming a second contact hole through which the catalyst layer is exposed; forming a carbon nano tube lower electrode on the catalyst layer within the second contact hole; and forming a phase change layer and an upper electrode in sequence on the carbon nano tube lower electrode and the second insulating interlayer.

The step of forming the contact plug may include the steps of: forming a barrier layer on the first contact hole surface and the first insulating interlayer; forming an electrically conductive layer on the barrier layer to fill the first contact hole; etching the electrically conductive layer until the barrier layer is exposed; etching a barrier layer portion formed on the first insulating interlayer and a barrier layer portion formed in the upper-end portion of the first contact hole; and etching an electrically conductive layer portion remaining in the upper-end portion of the first contact hole to the height of the barrier layer.

The barrier layer may be a TiN layer, and the electrically conductive layer may be a tungsten layer.

The step of forming the catalyst layer may include the steps of: forming a catalyst material layer on the first insulating interlayer including the contact plug in such a manner so as to fill the first contact hole; and chemical-mechanical-polishing the catalyst material layer until the first insulating interlayer is exposed.

The catalyst layer may be made of any one selected from the group consisting of TiN, TiAlN, Co and Ru.

The carbon nano tube lower electrode may be formed in such a manner so as to have the same diameter as that of the second contact hole.

The carbon nano tube lower electrode may be formed in such a manner so as to have a lower height than that of the second contact hole.

The phase change layer may be formed in such a manner so as to fill the upper-end portion of the second contact hole where the carbon nano tube lower electrode is not formed.

The carbon nano tube lower electrode may be formed in such a manner so as to have a smaller diameter than that of the second contact hole.

The method according to this embodiment of the present invention may further include the step of forming a sidewall insulating layer interposed between the carbon nano tube lower electrode and the second insulating interlayer.

The sidewall insulating layer may be made of a porous material with a higher porosity than that of the second insulating interlayer.

The sidewall insulating layer may be formed in such a manner so as to have the same height as that of the carbon nano tube lower electrode and a lower height than that of the second insulating interlayer.

The step of forming the sidewall insulating layer may include the steps of: growing a carbon nano tube on the middle portion of the catalyst layer in such a manner so as to have a smaller diameter than that of the second contact hole and a lower height than that of the second insulating interlayer, thereby forming the carbon nano tube lower electrode; forming an insulating layer on the second insulating interlayer including the second contact hole within which the carbon nano tube lower electrode is formed; and etching back the insulating layer until the carbon nano tube lower electrode is exposed.

The sidewall insulating layer may be formed in such a manner so as to have the same height as that of the second insulating interlayer and a higher height than that of the carbon nano tube lower electrode.

The step of forming the sidewall insulating layer may include the steps of: growing a carbon nano tube on the middle portion of the catalyst layer in such a manner so as to have a smaller diameter than that of the second contact hole and a lower height than that of the second insulating interlayer, thereby forming the carbon nano tube lower electrode; forming an insulating layer on the second insulating interlayer including the second contact hole within which the carbon nano tube lower electrode is formed; chemical-mechanical-polishing the insulating layer and a partial thickness of the second insulating interlayer until the carbon nano tube lower electrode is exposed; and selectively etching a partial thickness of the upper-end portion of the exposed carbon nano tube lower electrode.

The sidewall insulating layer may be formed in such a manner so as to have the same height as those of the carbon nano tube lower electrode and the second insulating interlayer.

The step of forming the sidewall insulating layer may include the steps of: growing a carbon nano tube on the middle portion of the catalyst layer in such a manner so as to have a smaller diameter than that of the second contact hole and a lower height than that of the second insulating interlayer, thereby forming the carbon nano tube lower electrode; forming an insulating layer on the second insulating interlayer including the second contact hole within which the carbon nano tube lower electrode is formed; and chemical-mechanical-polishing the insulating layer and a partial thickness of the second insulating interlayer until the carbon nano tube lower electrode is exposed.

DESCRIPTION OF SPECIFIC EMBODIMENTS

Figure 1:
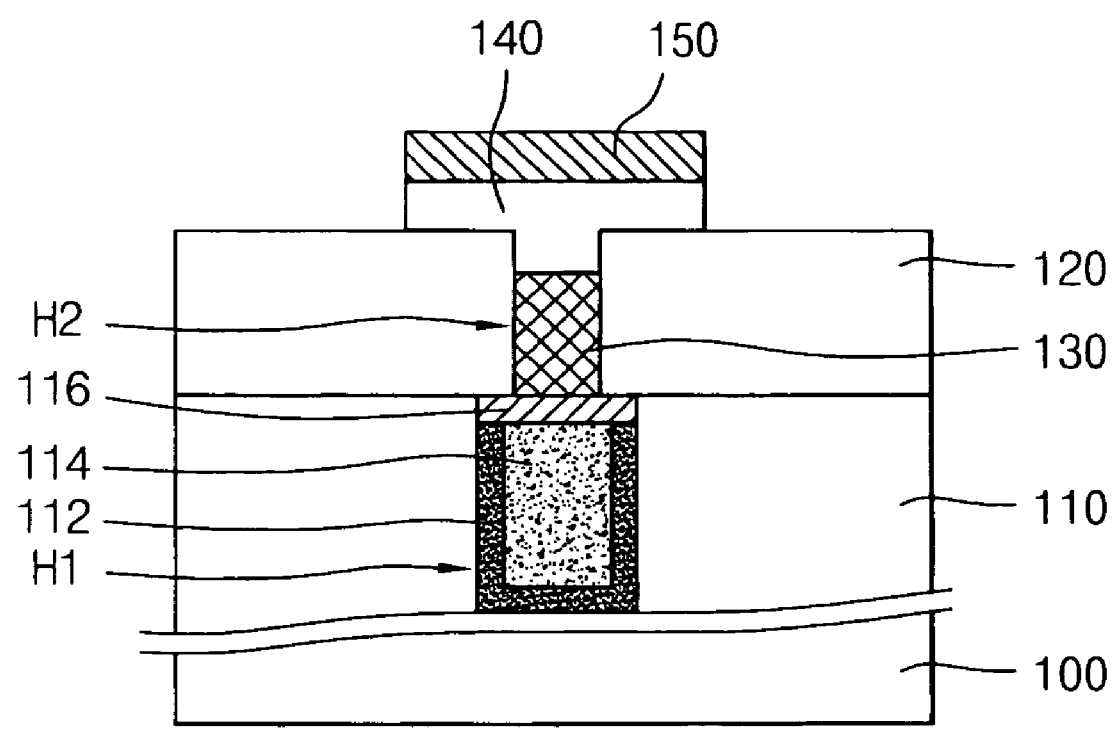
FIG. 1 is a cross-sectional view illustrating a phase change memory device in accordance with a first preferred embodiment of the present invention.

In the present invention, a contact plug is formed in such a manner so as to be recessed within the contact hole, and an electrically conductive pattern, that is, a catalyst layer, is formed in the upper-end portion of the contact hole where the contact plug is removed. Further, a carbon nano tube is grown on the catalyst layer to thereby form a carbon nano tube lower electrode.

In contrast with the prior art, the present invention does not require use of a damascene process in forming an electrically conductive pattern. Thus, the present invention solves conventional disadvantages, specifically the increase in the overall device height and troublesome processes due to the formation of the electrically conductive pattern, and can also reduce the process burden.

Reference will now be made in detail to a phase change memory device and a manufacturing method thereof according to various embodiments of the present invention with reference to the accompanying drawings.

FIGS. 1, 3, 5, and 6 show cross-sectional views of phase change memory devices according to preferred embodiments of the present invention.

A phase change memory device according to an embodiment of the present invention includes a first insulating interlayer 110 with a first contact hole H1 formed on a semiconductor substrate 100, a contact plug 114 formed in such a manner so as to be recessed within the first contact hole H1, a catalyst layer 116 formed on the contact plug 114 in such a manner so as to fill the first contact hole H1, a second insulating interlayer 120 with a second contact hole H2, through which the catalyst layer 116 is exposed, formed on the first insulating interlayer 110, a carbon nano tube lower electrode 130 formed on the catalyst layer 116 within the second contact hole H2, a phase change layer 140 formed on the carbon nano tube lower electrode 130, and an upper electrode 150.

A barrier layer 112 is interposed between the contact plug 114 and the first insulating interlayer 110. The phase change layer 140 is formed on the carbon nano tube lower electrode 130 and a second insulating interlayer portion 120 around the second contact hole H2. The catalyst layer 116 is made of TiN, TiAlN, Co or Ru, and functions as a catalytic agent for the growth of the carbon nano tube.

As illustrated in FIG. 1, the carbon nano tube lower electrode 130 may have the same diameter as that of the second contact hole H2. Further, as illustrated in FIGS. 3, 4 and 5, the carbon nano tube lower electrode 130 may also be formed with a smaller diameter than that of the second contact hole H2.

Figure 3:
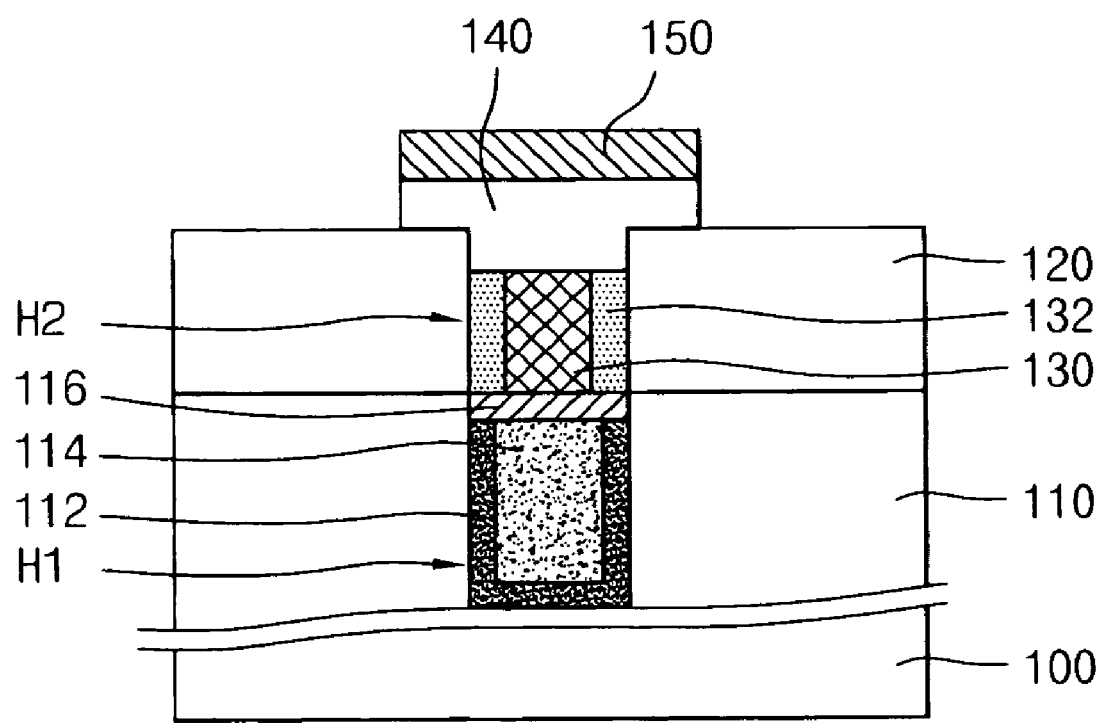
FIG. 3 is a cross-sectional view illustrating a phase change memory device in accordance with a second preferred embodiment of the present invention.
Figure 4A:
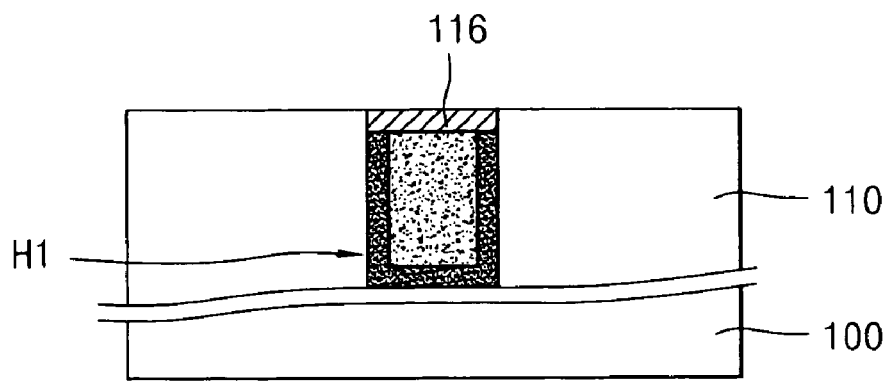
FIGS. 4A to 4E are cross-sectional views for explaining a method of manufacturing the phase change memory device in accordance with the second preferred embodiment of the present invention.
Figure 4B:
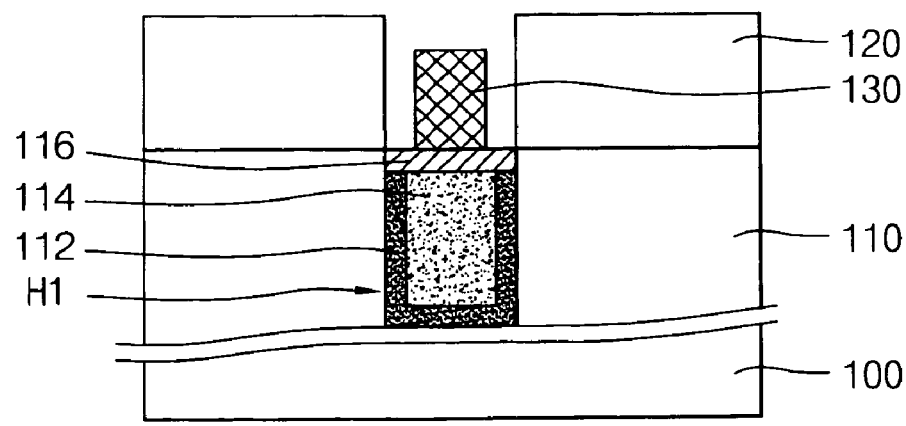
Figure 4C:
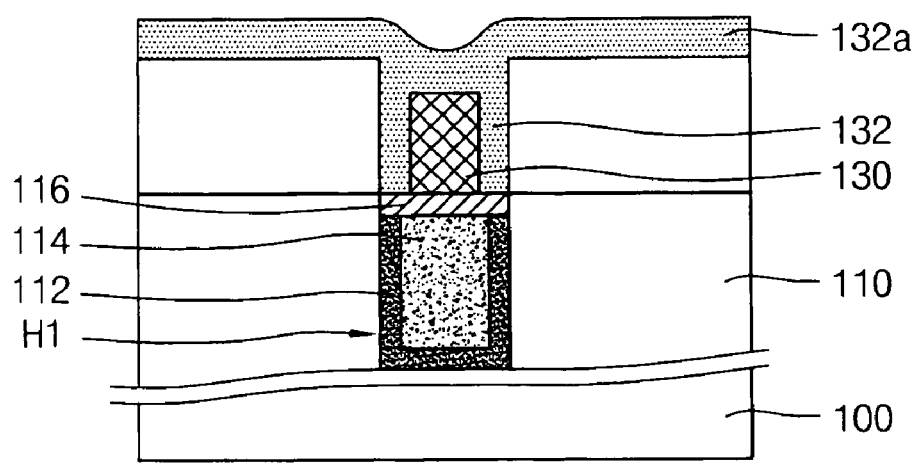
Figure 4D:
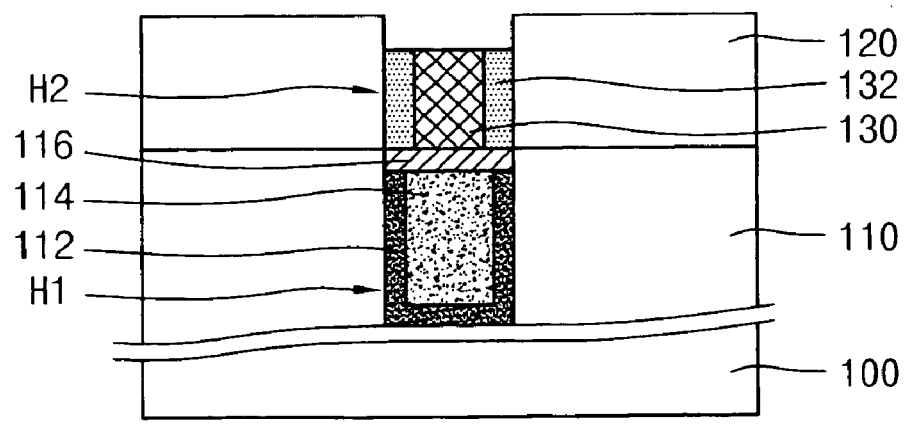
Figure 4E:
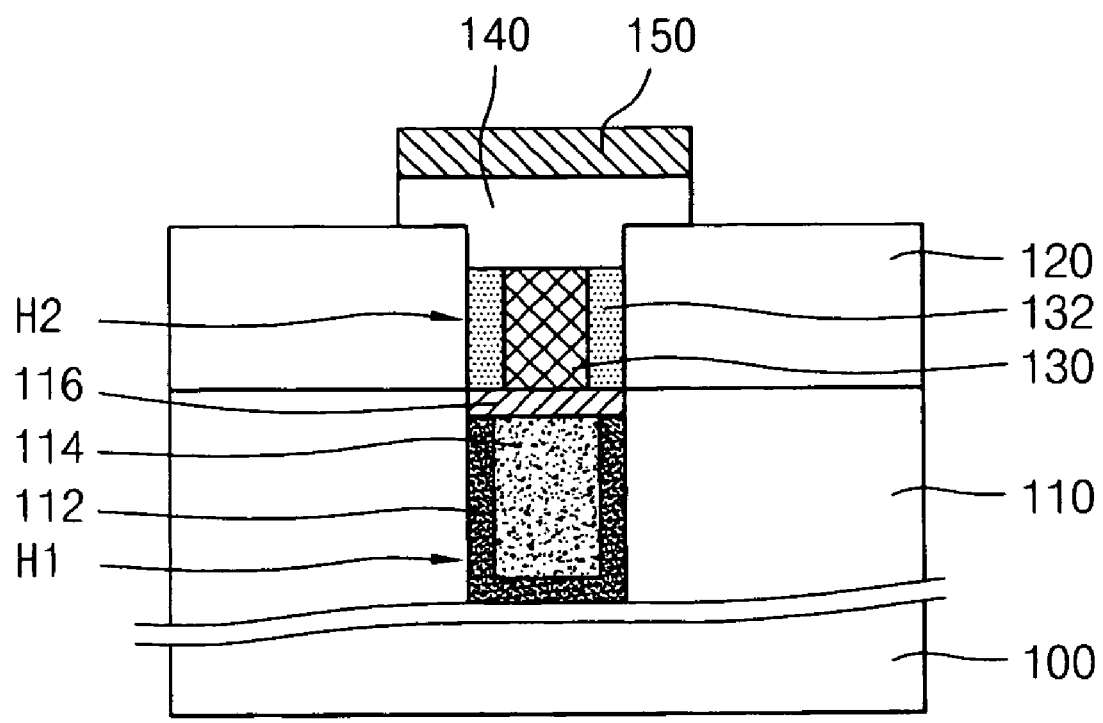
Figure 5:
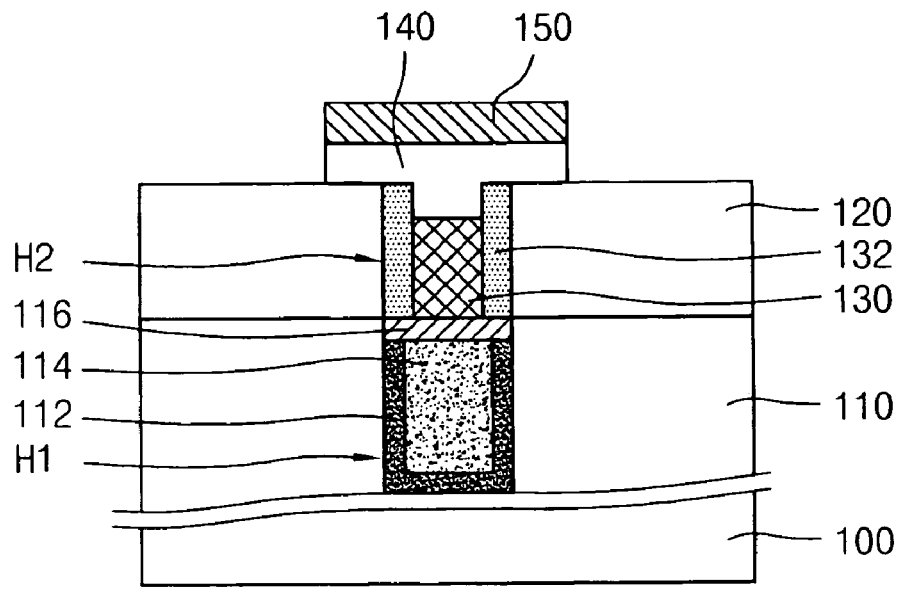
FIG. 5 is a cross-sectional view illustrating a phase change memory device in accordance with a third preferred embodiment of the present invention.

When the carbon nano tube lower electrode 130 is formed with a smaller diameter than that of the second contact hole H2, as illustrated in FIGS. 3, 4 and 5, a sidewall insulating layer 132 is interposed between the carbon nano tube lower electrode 130 and the second insulating interlayer 120. The sidewall insulating layer 132 is preferably made of a porous material with a higher porosity than that of the second insulating interlayer 120, and functions to restrain the carbon nano tube lower electrode 130 from emitting heat through the second insulating interlayer 120.

Figure 6:
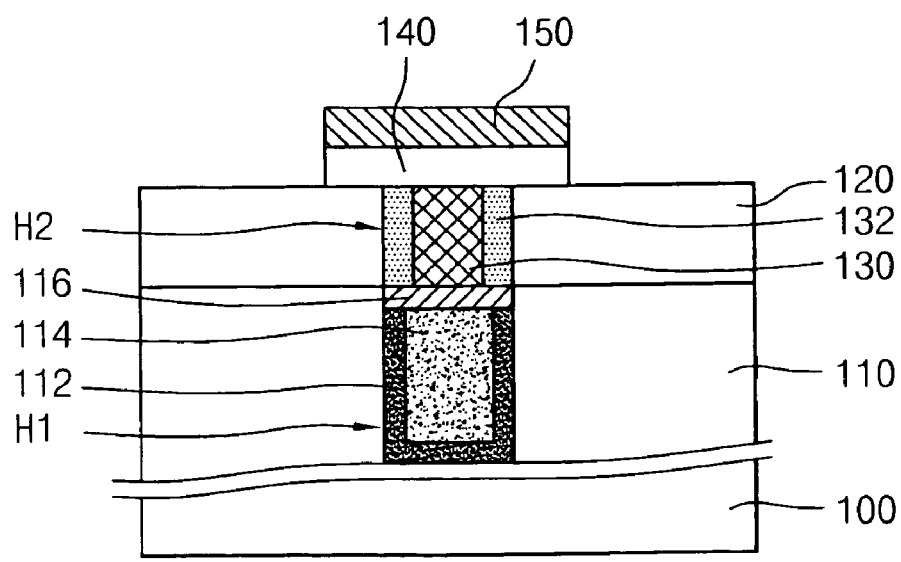
FIG. 6 is a cross-sectional view illustrating a phase change memory device in accordance with a fourth preferred embodiment of the present invention.

As illustrated in FIG. 3, the sidewall insulating layer 132 may be formed in such a manner so as to have the same height as that of the carbon nano tube lower electrode 130 and a lower height than that of the second insulating interlayer 120. Further, as illustrated in FIG. 5, the sidewall insulating layer 132 may also be formed in such a manner so as to have a lower height than that of the carbon nano tube lower electrode 130 and the same height as that of the second insulating interlayer 120, that is, the same height as that of the second contact hole H2. Furthermore, as illustrated in FIG. 6, the sidewall insulating layer 132 may also be formed in such a manner so as to have the same height as those of both the carbon nano tube lower electrode 130 and the second insulating interlayer 120.

Hereinafter, a method of manufacturing the phase change memory device according to the present invention will be described in detail.

FIGS. 2A to 2H show cross-sectional views illustrating the method of manufacturing a phase change memory device according to a first preferred embodiment of the present invention.

Figure 2A:
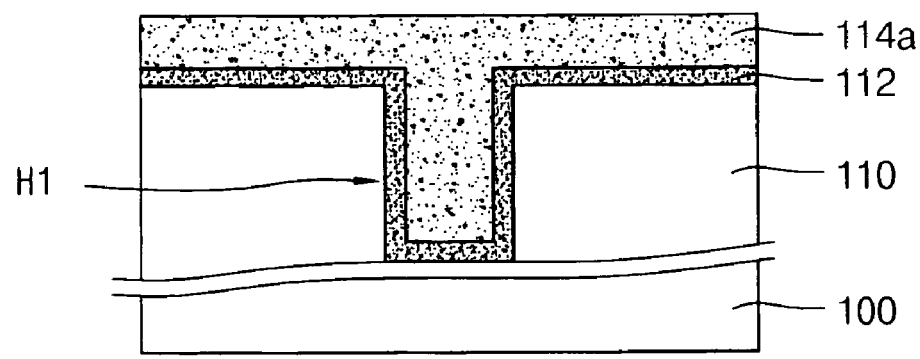
FIGS. 2A to 2H are cross-sectional views for explaining a method of manufacturing the phase change memory device in accordance with the first preferred embodiment of the present invention.

Referring to FIG. 2A, a first insulating interlayer 110 is formed on a semiconductor substrate 100 having a substructure (not shown) such as a transistor or the like, and the first insulating interlayer 110 is etched to form a first contact hole H1. A barrier layer 112, such as a TiN layer, is formed on the first insulating interlayer 110 and the surface of the first contact hole H1, and an electrically conductive layer 114*a*, such as a tungsten layer, is formed on the barrier layer 112 in such a manner so as to fill the first contact hole H1.

Figure 2B:
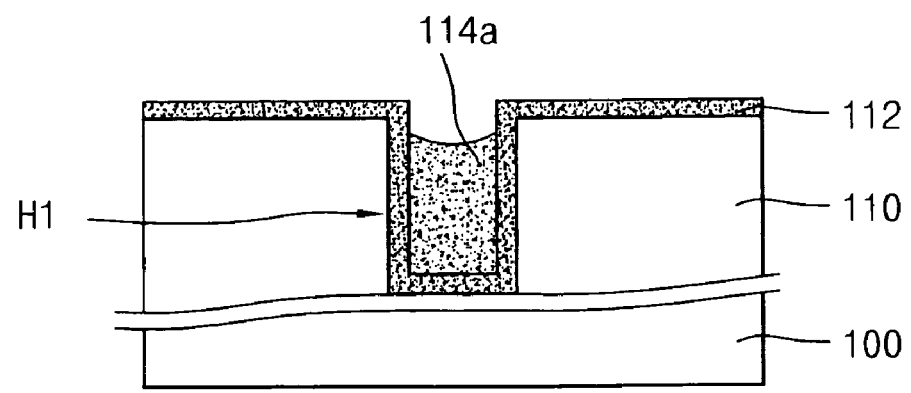

Referring to FIG. 2B, the electrically conductive layer 114*a* is etched using an etching gas containing N2 and SF6 until the barrier layer 112 is exposed. As a result of this, a portion of the electrically conductive layer 114*a* formed in the upper-end portion of the first contact hole H1 is lost.

Figure 2C:
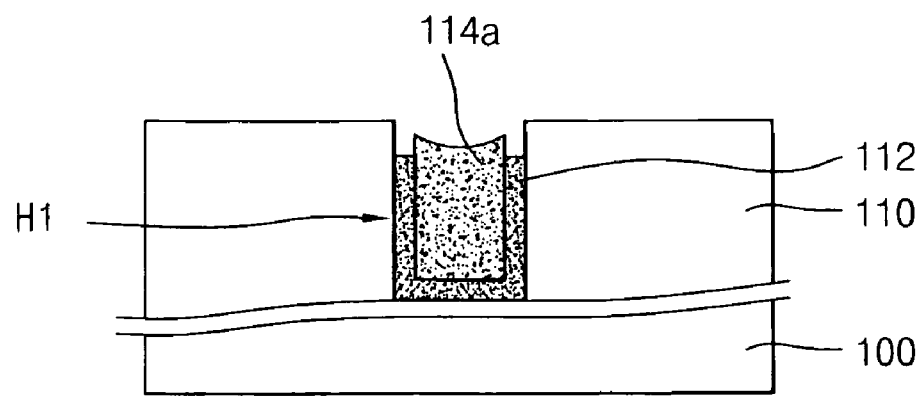

Referring to FIG. 2C, a portion of the barrier layer 112 formed on the first insulating interlayer 110 and the barrier layer 112 formed in the upper-end portion of the first contact hole H1 are etched using an etching gas containing BC13 and C12. In this step, the electrically conductive layer 114*a* has a height slightly higher than that of the residual barrier layer 112.

Figure 2D:
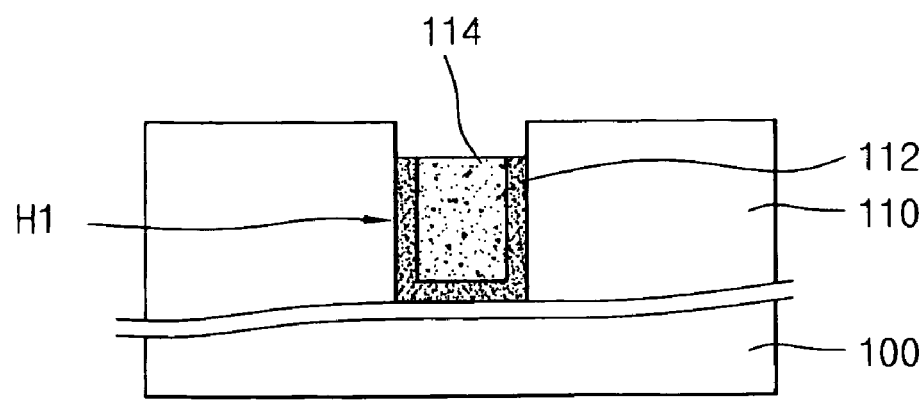

Referring to FIG. 2D, a portion of the electrically conductive layer 114*a* protruding from the barrier layer 112, is minutely etched using an etching gas containing N2 and SF6 to thereby form a contact plug 114 which consists of the remaining electrically conductive layer 114*a* within the first contact hole H1. In this step, the barrier layer 112 and the contact plug 114 are substantially planarized within the first contact hole H1.

Figure 2E:
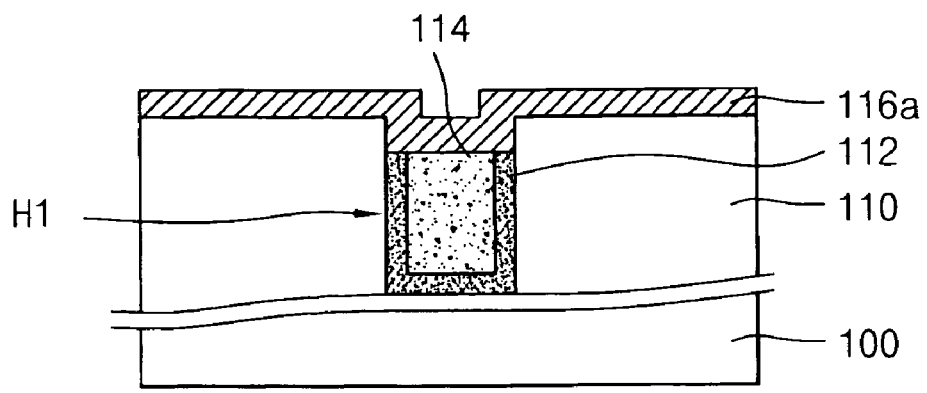

Referring to FIG. 2E, a catalyst material layer 116*a* is formed on the first insulating interlayer 110 and the contact plug 114 including the barrier layer 112 in such a manner so as to fill the upper-end portion of the first contact hole H1 where the barrier layer 112 and the contact plug 114 are removed. The catalyst material layer 116*a* is made of TiN, TiAlN, Co or Ru.

Figure 2F:
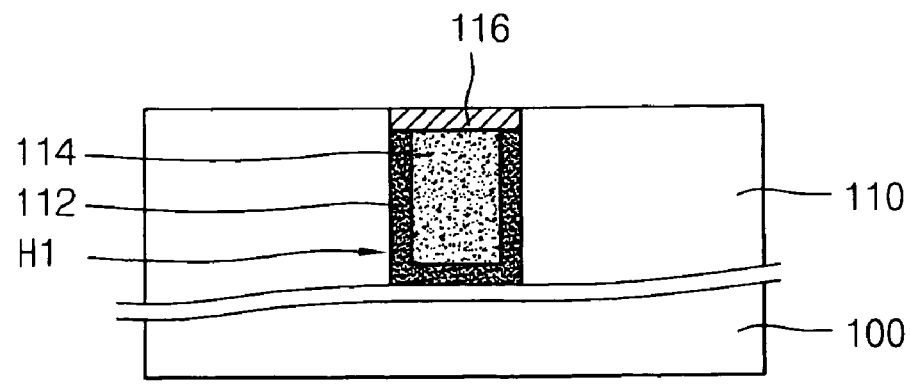

Referring to FIG. 2F, the catalyst material layer 116*a* is subjected to CMP until the first insulating interlayer 110 is exposed, thereby forming a catalyst layer 116 filling the upper-end portion of the first contact hole H1. The catalyst layer 116 functions as a catalyst for growing a carbon nano tube in the subsequent step and prevents the seam generated inside of the contact plug 114 by the formation thereof from causing problems.

Figure 2G:
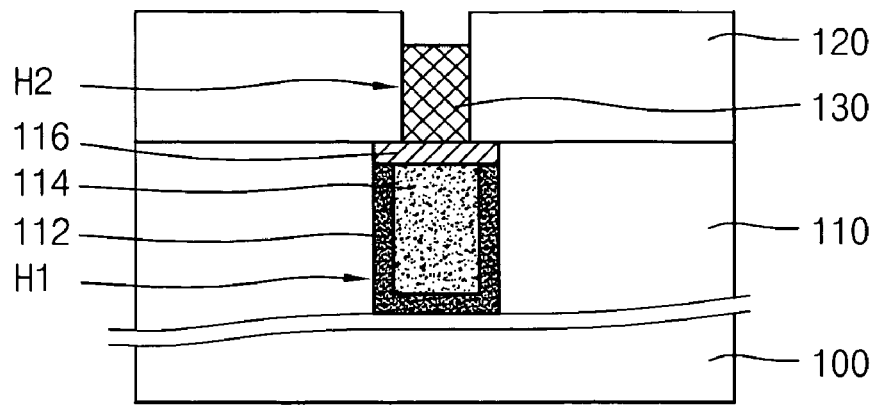

Referring to FIG. 2G, a second insulating interlayer 120 is formed on the first insulating interlayer 110 including the catalyst layer 116, and the second insulating interlayer 120 is etched to form a second contact hole H2 through which the catalyst layer 116 is exposed. A carbon nano tube is grown on the catalyst layer 116 in such a manner so as to fill the second contact hole H2, thereby forming a carbon nano tube lower electrode 130. Here, growing the carbon nano tube is performed using a thermal Chemical Vapor Deposition (CVD) process, a plasma CVD process, an electron cyclotron resonance CVD process, an electrical discharge process, a laser deposition process or the like. Further, the height of the carbon nano tube can be adjusted by controlling the process time.

In this embodiment, the carbon nano tube lower electrode 130 is formed in such a manner so as to be recessed within the second contact hole H2. To this end, the carbon nano tube lower electrode 130 formed in such a manner so as to be recessed within the second contact hole H2 may be formed by growing a carbon nano tube layer with a lower height than that of the second insulating interlayer 120 from the outset or may be formed by growing a carbon nano tube layer with a higher height than that of the second insulating interlayer 120 and then performing insulating layer deposition, CMP and selective etching of the carbon nano tube layer.

Figure 2H:
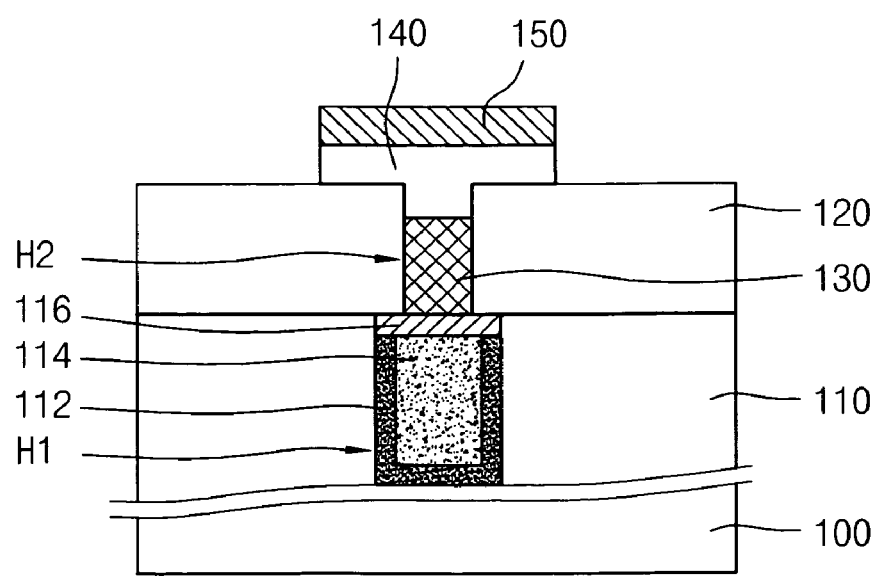

Referring to FIG. 2H, a phase change material layer is formed on the carbon nano tube lower electrode 130 and the second insulating interlayer 120 in such a manner so as to fill the upper-end portion of the second contact hole H2, and an electrically conductive layer for an upper electrode is formed on the phase change material layer. The electrically conductive layer for the upper electrode and the phase change material layer are etched to form a phase change layer 140, which makes contact with the carbon nano tube lower electrode 130 and the upper electrode 150 positioned on the phase change layer 140.

Thereafter, although not shown in the drawings, the phase change memory device according to this embodiment is completed by successively performing a series of known subsequent processes.

As stated above, in the present invention, the contact plug 114 is formed in the lower-end portion of the first contact hole H1, and the catalyst layer 116 is formed to the height of the first contact hole H1 on the contact plug 114. Further, the carbon nano tube lower electrode 130 is formed on the catalyst layer 116. Here, since the catalyst layer 116 corresponds to an electrically conductive pattern of the prior art, a damascene process for forming the catalyst layer 116 need not be separately performed in the present invention.

Therefore, the present invention makes it possible to manufacture a phase change memory device with a simple structure and a reduced overall height. Further, due to the reduction in overall height, the electrical transmission path can be shortened, which results in low power consumption and high operation speed of the device.

FIGS. 4A to 4E show cross-sectional views for explaining a method of manufacturing a phase change memory device according to a second preferred embodiment of the present invention. In the drawings, the same reference numerals designate the same constitutional parts as those in FIGS. 2A to 2H.

Referring to FIG. 4A, by successively performing the same steps as those illustrated in FIGS. 2A to 2F, a contact plug 114 and a barrier layer 112, the top portion of which is recessed into a first contact hole H1 within a first insulating interlayer 110, are formed, and a catalyst layer 116 is formed in such a manner so as to fill the upper-end portion of the first contact hole H1.

Referring to FIG. 4B, a second insulating interlayer 120 is formed on the first insulating interlayer 110 including the catalyst layer 116, and the second insulating interlayer 120 is etched to form a second contact hole H2 through which the catalyst layer 116 is exposed. A carbon nano tube lower electrode 130 is formed by growing a carbon nano tube with a smaller diameter than that of the second contact hole H2 and a lower height than that of the second insulating interlayer 120 on the middle portion of the exposed catalyst layer 116.

The carbon nano tube lower electrode 130 may be formed by forming a spacer layer on the sidewall of the second contact hole H2 and then growing a carbon nano tube from the catalyst layer 116, and may also be formed in other ways.

Referring to FIG. 4C, an insulating layer 132a is formed on the second insulating interlayer 120 including the second contact hole H2, within which the carbon nano tube lower electrode 130 is formed, in such a manner so as to fill the space between the carbon nano tube lower electrode 130 and the second insulating interlayer 120. It is preferred that the insulating layer 132a is made of a porous material with a higher porosity than that of the second insulating interlayer 120.

Referring to FIG. 4D, the insulating layer 132a is etched back until the carbon nano tube lower electrode 130 is exposed, thereby forming a sidewall insulating layer 132 of the same height as the carbon nano tube lower electrode 130 between the carbon nano tube lower electrode 130 and the second insulating interlayer 120.

Referring to FIG. 4E, a phase change material layer and an electrically conductive layer for an upper electrode are formed in sequence on the sidewall insulating layer 132, the carbon nano tube lower electrode 130 and the second insulating interlayer 120, and then the phase change material layer and the electrically conductive layer for an upper electrode are etched to form a phase change layer 140 which makes contact with the carbon nano tube lower electrode 130, and the upper electrode 150 located on the phase change layer 140.

Thereafter, although not shown in the drawings, the phase change memory device according to this embodiment is completed by successively performing a series of known subsequent processes.

In this way, since the carbon nano tube lower electrode 130 is formed in such a manner so as to have a smaller diameter than that of the second contact hole H2, and the porous sidewall insulating layer 132 is interposed between the carbon nano tube lower electrode 130 and the second insulating interlayer 120, the contact area between the carbon nano tube lower electrode 130 and the phase change layer 140 can be further reduced, and heat emission from the carbon nano tube lower electrode 130 can be restrained. Thus, the power consumption of the device can be further reduced and the operation speed of the device can be further improved.

Although not shown, if after the insulating layer 132a is formed as illustrated in FIG. 4C, the insulating layer 132a and a partial thickness of the second insulating interlayer 120 are chemical-mechanical-polished until the carbon nano tube lower electrode 130 is exposed. A partial thickness of the upper end portion of the exposed carbon nano tube lower electrode 130 is then selectively etched, and a phase change memory device according to the third preferred embodiment of the present invention is manufactured, in which the sidewall insulating layer 132 and the second insulating interlayer 120 have the same height and whereas the carbon nano tube lower electrode 130 has a lower height than those of the sidewall insulating layer 132 and the second insulating interlayer 120, as illustrated in FIG. 5.

Although not shown, if after the insulating layer 132a is formed as illustrated in FIG. 4C, the insulating layer 132a and a partial thickness of the second insulating interlayer 120 are chemical-mechanical-polished until the carbon nano tube lower electrode 130 is exposed, the height of the carbon nano tube lower electrode 130 becomes identical to that of the second insulating interlayer 120, and the sidewall insulating layer 132, of the same height as the carbon nano tube lower electrode 130 and the second insulating interlayer 120, remains therebetween. As a result, a phase change memory device according to the fourth preferred embodiment of the present invention as illustrated in FIG. 6 is manufactured.

As described above, according to the phase change memory device and its manufacturing method of the present invention, a separate damascene process for forming a catalyst layer need not be performed because a contact plug including a barrier layer is formed in such a manner so as to be recessed within the contact hole, and a catalyst layer is formed in the upper-end portion of the contact hole where the contact plug is not formed. Thus, owing to the fact that the damascene process is not required, the process burden is reduced. Further, since the heat emission characteristic of a carbon nano tube lower electrode can be improved, the phase change memory device of the present invention can achieve low power consumption and high operation speed. Furthermore, the phase change memory device can have a simple structure since the overall height is reduced.

Although preferred embodiments of the present invention have been described for illustrative purposes, the present invention is not limited thereto, and those skilled in the art will appreciate that various modifications, additions and substitutions are possible, without departing from the scope and spirit of the invention as disclosed in the accompanying claims.

What is claimed is:

1. A phase change memory device comprising a data storage unit comprising:
   a semiconductor substrate;
   a first insulating interlayer having a first contact hole formed on the semiconductor substrate;
   a contact plug made of an electrically conductive material and formed to partially fill the first contact hole;
   a catalyst layer formed on the contact plug, wherein the catalyst layer comprises a catalytic agent capable of promoting growth of a carbon nano tube and is formed on the contact plug to fill the first contact hole;
   a second insulating interlayer formed on the first insulating interlayer including the catalyst layer, wherein the second insulating interlayer has a second contact hole through which the catalyst layer is exposed,
   a carbon nano tube lower electrode formed on the catalyst layer, wherein the carbon nano tube lower electrode is formed inside the second contact hole contacting the catalyst layer;
   a phase change layer formed on the carbon nano tube lower electrode, the phase change layer also being formed on a portion around the second contact hole on the second insulating interlayer portion; and
   an upper electrode formed on the phase change layer, wherein the phase change layer is capable of changing phase when current is applied between the lower and upper electrodes.

2. The phase change memory device of claim 1, wherein the contact plug is made of tungsten.

3. The phase change memory device of claim 1, further comprising a barrier layer interposed between the contact plug and the first insulating interlayer.

4. The phase change memory device of claim 3, wherein the barrier later is made of TiN.

5. The phase change memory device of claim 1, wherein the second contact hole has a diameter and the carbon nano tube lower electrode is formed to have a diameter substantially same as the diameter of the second contact hole.

6. The phase change memory device of claim 5, wherein the carbon nano tube lower electrode formed inside the second contact hole is lower in height than the total depth of the second contact hole.

7. The phase change memory device of claim 1, wherein the second contact hole has a diameter and the carbon nano tube lower electrode is formed to have a diameter smaller than the diameter of the second contact hole.

8. The phase change memory device of claim 7, further comprising a sidewall insulating layer interposed between the carbon nano tube lower electrode and the second insulating interlayer.

9. The phase change memory device of claim 8, wherein both the carbon nano tube lower electrode and the sidewall insulating layer formed inside the second contact hole are lower in height than the total depth of the second contact hole.

10. The phase change memory device of claim 8, wherein the carbon nano tube lower electrode is formed inside the second contact hole to have a lower height than that of the second contact hole, and the sidewall insulating layer is formed inside the second contact hole to have substantially the same height as that of the second contact hole.

11. The phase change memory device of claim 8, wherein both the carbon nano tube lower electrode and the sidewall insulating layer are formed inside the second contact hole to have substantially the same height as that of the second contact hole.

12. The phase change memory device of claim 8, wherein the sidewall insulating layer is made of a porous material of a higher porosity than the second insulating interlayer.

13. The phase change memory device of claim 1, wherein the catalyst layer includes at least one of TiN, TiAlN, Co, and Ru.

14. The phase change memory device of claim 1, wherein the carbon nano tube lower electrode is formed inside the second contact hole partially filling the second contact hole.

15. The phase change memory device of claim 14, wherein the phase change layer is formed in the upper-end portion of the second contact hole, which is partially filled with the carbon nano tube lower electrode.

16. A method of manufacturing a phase change memory device, the method comprising the steps of:
    forming a first insulating interlayer, which has a first contact hole, on a semiconductor substrate;
    forming a contact plug inside the first contact hole partially filling the first contact hole;
    forming a catalyst layer on the contact plug inside the first contact hole substantially filling the first contact hole;
    forming a second insulating interlayer on the first insulating interlayer including the catalyst layer;
    etching the second insulating interlayer to form a second contact hole exposing the catalyst layer;
    forming a carbon nano tube lower electrode on the catalyst layer inside the second contact hole; and
    forming a phase change layer on the carbon nano tube lower electrode and at least on a portion of the second insulating layer near the second contact hole; and
    forming an upper electrode on the phase change layer.

17. The method of claim 16, wherein the step of forming the contact plug comprises the steps of:
    forming a barrier layer on the first contact hole surface and the first insulating interlayer;
    forming an electrically conductive layer on the barrier layer to fill the first contact hole;
    etching the electrically conductive layer until the barrier layer is exposed;
    etching a barrier layer portion formed on the first insulating interlayer and a barrier layer portion formed in the upper end portion of the first contact hole; and
    etching an electrically conductive layer portion remaining in the upper end portion of the first contact hole to the height of the barrier layer.

18. The method of claim 17, wherein the barrier layer includes a TiN layer.

19. The method of claim 17, wherein the electrically conductive layer includes a tungsten layer.

20. The method of claim 16, wherein the step of forming the catalyst layer comprises the steps of:
    forming a catalyst material layer on the first insulating interlayer including the contact plug to fill the first contact hole; and
    chemical-mechanical-polishing the catalyst material layer until the first insulating interlayer is exposed.

21. The method of claim 20, wherein the catalyst layer includes at least one of TiN, TiAlN, Co and Ru.

22. The method of claim 16, wherein the carbon nano tube lower electrode is formed to have the same diameter as that of the second contact hole.

23. The method of claim 22, wherein the carbon nano tube lower electrode is formed to have a lower height than that of the second contact hole.

24. The method of claim 23, wherein the phase change layer is formed to fill the upper end portion of the second contact hole where the carbon nano tube lower electrode is not formed.

25. The method of claim 16, wherein the carbon nano tube lower electrode is formed to have a smaller diameter than that of the second contact hole.

26. The method of claim 25, further comprising the step of forming a sidewall insulating layer interposed between the carbon nano tube lower electrode and the second insulating interlayer.

27. The method of claim 24, wherein the sidewall insulating layer is made of a porous material having a higher porosity than that of the second insulating interlayer.

28. The method of claim 27, wherein the sidewall insulating layer is formed to have the same height as that of the carbon nano tube lower electrode and a lower height than that of the second insulating interlayer.

29. The method of claim 28, wherein the step of forming the sidewall insulating layer comprises the steps of:
    growing a carbon nano tube on a middle portion of the catalyst layer to have a smaller diameter than that of the second contact hole and a lower height than that of the second insulating interlayer, thereby forming the carbon nano tube lower electrode;
    forming an insulating layer on the second insulating interlayer including the second contact hole within which the carbon nano tube lower electrode is formed; and
    etching back the insulating layer until the carbon nano tube lower electrode is exposed.

30. The method of claim 26, wherein the sidewall insulating layer is formed to have the same height as that of the second insulating interlayer and a higher height than that of the carbon nano tube lower electrode.

31. The method of claim 30, wherein the step of forming the sidewall insulating layer comprises the steps of:
    growing a carbon nano tube on a middle portion of the catalyst layer to have a smaller diameter than that of the second contact hole and a lower height than that of the second insulating interlayer, thereby forming the carbon nano tube lower electrode;
    forming an insulating layer on the second insulating interlayer including the second contact hole within which the carbon nano tube lower electrode is formed;
    chemical-mechanical-polishing the insulating layer and a partial thickness of the second insulating interlayer until the carbon nano tube lower electrode is exposed; and selectively etching a partial thickness of an upper end portion of the exposed carbon nano tube lower electrode.

32. The method of claim 26, wherein the sidewall insulating layer is formed to have the same height as those of the carbon nano tube lower electrode and the second insulating interlayer.

33. The method of claim 32, wherein the step of forming the sidewall insulating layer comprises the steps of:

growing a carbon nano tube on a middle portion of the catalyst layer to have a smaller diameter than that of the second contact hole and a lower height than that of the second insulating interlayer, thereby forming the carbon nano tube lower electrode;

forming an insulating layer on the second insulating interlayer including the second contact hole within which the carbon nano tube lower electrode is formed; and chemical-mechanical-polishing the insulating layer and a partial thickness of the second insulating interlayer until the carbon nano tube lower electrode is exposed.

* * * * *